United States Patent
Lee et al.

(10) Patent No.: US 7,372,083 B2
(45) Date of Patent: May 13, 2008

(54) EMBEDDED SILICON-CONTROLLED RECTIFIER (SCR) FOR HVPMOS ESD PROTECTION

(75) Inventors: Jian-Hsing Lee, Hsin-Chu (TW); Yu-Chang Jong, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 365 days.

(21) Appl. No.: 11/199,662

(22) Filed: Aug. 9, 2005

(65) Prior Publication Data

US 2007/0034956 A1    Feb. 15, 2007

(51) Int. Cl.
*H01L 29/72*    (2006.01)
(52) U.S. Cl. .................. 257/173; 257/336; 257/255
(58) Field of Classification Search ............... 257/173, 257/336, 355
See application file for complete search history.

(56) References Cited

U.S. PATENT DOCUMENTS

| | | |
|---|---|---|
| 5,872,379 A | 2/1999 | Lee |
| 6,066,879 A | 5/2000 | Lee et al. |
| 6,268,992 B1 | 7/2001 | Lee et al. |
| 6,459,127 B1 | 10/2002 | Lee et al. |

OTHER PUBLICATIONS

Lin et al, EOSESD Symposium, 2004, pp. 265-271.*
Lin K.-H., et al., "Design on Latchuo-Free Power-Rail ESD Clamp Circuit in High-Voltage CMOS ICs," EOS/ESD Symposium, 2004, pp. 265-271.

* cited by examiner

*Primary Examiner*—Edward Wojciechowicz
(74) *Attorney, Agent, or Firm*—Slater & Matsil, L.L.P.

(57) ABSTRACT

A high voltage p-type metal oxide semiconductor (HVPMOS) device having electrostatic discharge (ESD) protection functions and a method of forming the same are provided. The HVPMOS includes a PMOS transistor, wherein the PMOS transistor comprises a first source/drain region doped with a p-type impurity in a high voltage p-well (HVPW) region, a second source/drain region doped with a p-type impurity in a high voltage n-well (HVNW) region wherein the HVPW region and HVNW region physically contact each other, a field region substantially underlying a gate dielectric, and a first heavily doped n-type (N+) region in the HVPW region and contacting the first source/drain region. The device further includes an N+ buried layer underlying the HVPW region and the HVNW region and a p-type substrate underlying the N+ buried layer. The device has robust performance for both forward and reverse mode ESD.

16 Claims, 10 Drawing Sheets

EMBEDDED SILICON-CONTROLLED RECTIFIER (SCR) FOR HVPMOS ESD PROTECTION

TECHNICAL FIELD

This invention relates generally to the protection of semiconductor devices from electrostatic discharge, and more particularly to the protection of high voltage PMOS devices from electrostatic discharge.

BACKGROUND

High-voltage metal-oxide-semiconductor (HVMOS) transistors are widely used in many electrical devices, such as CPU power supplies, power management systems, AC/DC converters, etc.

FIG. 1 illustrates a conventional HVPMOS 2. The HVPMOS 2 includes a gate electrode 10, a gate oxide 12, a drain region 4 in a high-voltage p-well 16, and a source region 6 in a high-voltage n-well 14. A shallow trench isolation (STI) region 8 isolates the drain region 4 and gate electrode 10 so that a high drain-gate voltage can be applied. An N+ region 18 is typically formed adjacent the source region 6.

The conventional HVPMOS 2 suffers from electrostatic discharge (ESD). As is known in the art, a high potential may be generated to an input or output buffer of an integrated circuit, which may be caused by a person simply touching a package pin. When the electrostatic is discharged, a high current is produced through devices of the integrated circuit. Electrostatic discharge (ESD) is a serious problem for semiconductor devices since it has the potential to destroy the device and the entire integrated circuit. The HVPMOS 2 can sustain forward mode ESD. When a forward mode ESD transient occurs, causing the voltage at the drain region 4 to be higher than the voltage at the source region 6, an ESD current flows through the drain region 4, high-voltage p-well 16, high-voltage n-well 14, and N+ region 18, and is discharged. The HVPMOS 2 thus will not be damaged.

A reverse mode ESD, however, may damage the HVPMOS 2. When an ESD occurs at the source region 6 (and N+ region 18), a reversed diode between the high-voltage n-well 14 and high-voltage p-well 16 prevents ESD current from being conducted. As a result, the HVPMOS 2 or other neighboring devices will be damaged. One way of solving this problem is to form separate ESD protection devices to conduct ESD current and lower the voltage at the source region 6. However, extra cost and chip area are involved.

The preferred embodiments of the present invention provide a novel HVPMOS that is robust against both forward and reverse mode ESD.

SUMMARY OF THE INVENTION

A high voltage p-type metal oxide semiconductor (HVPMOS) device having electrostatic discharge (ESD) protection functions and a method of forming the same are provided.

In accordance with one aspect of the present invention, the preferred embodiment of the present invention is a PMOS silicon-controlled rectifier (PSCR) that includes a first source/drain region doped with a p-type impurity in a high voltage p-well region (HVPW), a second source/drain region doped with a p-type impurity in a high voltage n-well region (HVNW) wherein the HVPW and HVNW physically contact each other, a field region substantially underlying a gate dielectric, and a first heavily doped n-type (N+) region in the HVPW and adjacent the first source/drain region. The device further includes an N+ buried layer underlying the HVPW and HVNW and a p-type substrate underlying the N+ buried layer.

In accordance with another aspect of the present invention, the preferred embodiment of the present invention further includes a heavily doped p-type (P+) region in the HVPW and adjacent the first N+ region.

In accordance with yet another aspect of the present invention, the preferred embodiment of the present invention further includes a second heavily doped n-type (N+) region in the HVNW and adjacent the first source/drain region.

In accordance with yet another aspect of the present invention, the method of forming the preferred embodiments of the present invention includes forming a first high-voltage well region adjacent a second high-voltage well region, which has an opposite type as the first high-voltage well region. The method further includes forming a first field region substantially in the first high-voltage well region and substantially close to an interface of the first high-voltage well region and the second high-voltage well region, forming a first doped region in the first high-voltage well region and physically contacting the field region, and a second doped region in the second high-voltage well region, wherein the first and second doped regions have a first conductivity type, and forming a third doped region in the first high-voltage well region and in contact with the first doped region, wherein the third doped region is heavily doped with impurities having a second conductivity type. A gate dielectric and a gate electrode are formed on the field region and the first and second high-voltage well regions, wherein the gate dielectric has a first side edge substantially aligned with the second doped region, and a second side edge on the field region.

In accordance with yet another aspect of the present invention, the preferred embodiments of the present invention can be used as ESD protection devices. By parallel coupling the preferred embodiments of the present invention with the circuit to be protected, the ESD current can be conducted.

The steps for forming the first and second high-voltage well regions include providing a substrate having a first conductivity type, forming a buried layer in a top region of the substrate wherein the buried layer has a second conductivity type opposite the first conductivity type, forming a doped semiconductor layer having the first conductivity type over the buried layer, masking a sub region of the doped semiconductor layer, and doping the doped semiconductor layer with an impurity having the second conductivity type, wherein the sub region forms the first high-voltage well region, and an unmasked region of the doped semiconductor layer forms the second high-voltage well region. Alternatively, the doped semiconductor layer may be of the second conductivity type, and the first high-voltage well region is formed by doping with an impurity having the first conductivity type.

The preferred embodiments of the present invention include a high-voltage PMOS device and a parasitic silicon-controlled rectifier, which can be turned on by an ESD transient, thus protecting the PMOS device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are described with reference to FIGS. 2 through 12, and the operations of the preferred embodiments are discussed using equivalent circuits. Throughout the various views and illustrative embodiments of the present invention, like reference numbers are used to designate like elements.

Figure 1:
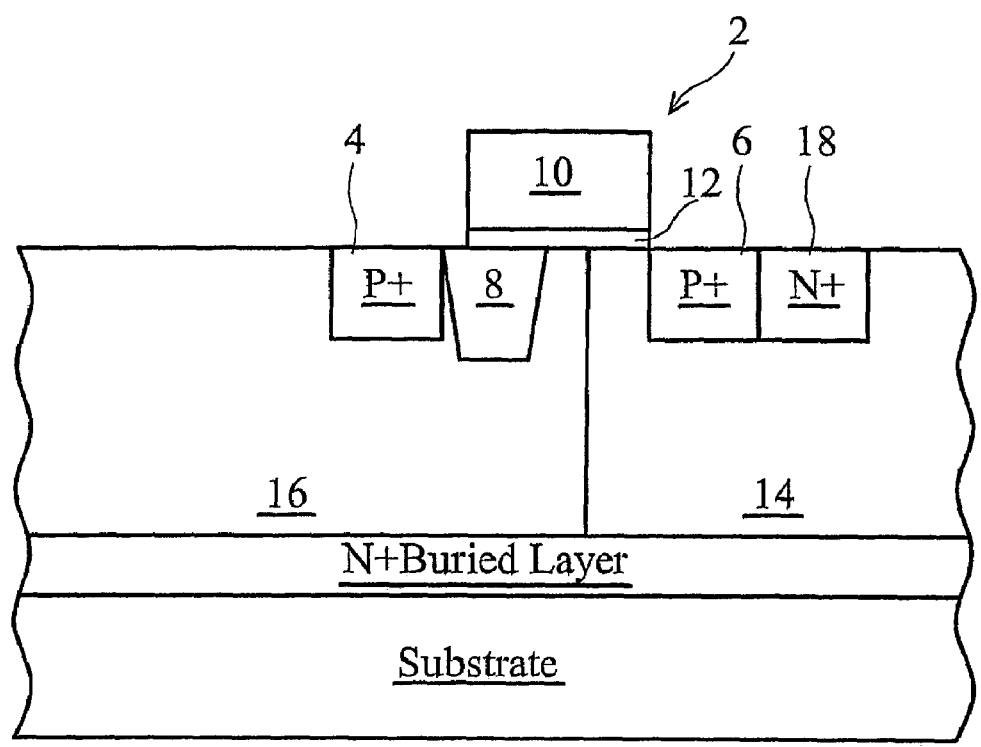
FIG. 1 illustrates a conventional high-voltage PMOS device that is protected from forward mode ESD, but vulnerable to reverse mode ESD.
Figure 2:
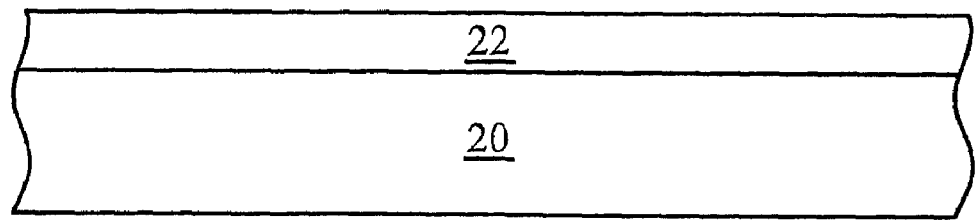
FIG 2 through 9 are cross-sectional views and FIGS. 10 through 12 are schematic views of intermediate stages in the manufacture of preferred embodiments of the present invention.

Referring to FIG. 2, a substrate 20 is provided. The substrate 20 preferably comprises a semiconductor material such as silicon, although other semiconductor materials may be used. The substrate 20 is preferably p-type. Alternatively, the substrate 20 may comprise an n-type substrate.

An N+ buried layer (NBL) 22 is formed in a top region of the substrate 20 proximate the substrate 20 top surface. The NBL 22 is preferably formed by implanting dopants into the top surface of the substrate 20. For example, antimony and/or arsenic may be implanted to a dopant concentration of about $10^{16}/cm^3$ to about $10^{18}/cm^3$. The dopant of the NBL 22 may then be driven into a top region of the substrate 20 by heating the substrate 20 to a temperature of about 1000 to 1100° C. In alternative embodiments, if the substrate 20 is n-type, a P+ buried layer will be formed instead. The NBL 22 acts as an electrical isolation region, isolating the subsequently formed devices over the NBL 22 from the substrate 20.

Figure 3:
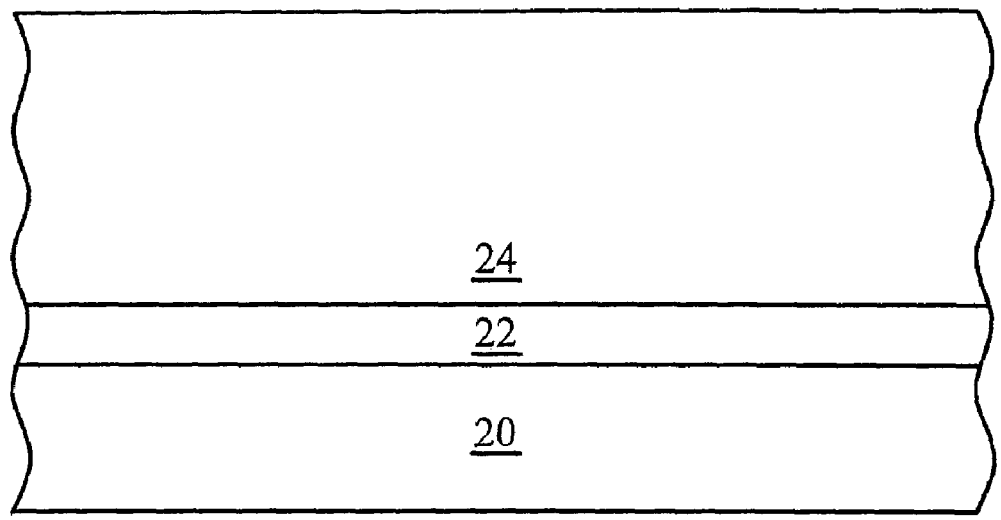

FIG. 3 illustrates a doped semiconductor layer 24 deposited over the NBL 22. The doped semiconductor layer 24 preferably comprises a semiconductor such as silicon, and is preferably doped with a p-type impurity. The doped semiconductor layer 24 is preferably epitaxially grown, and is alternatively referred to as P-epi layer 24, although other deposition methods may alternatively be used. While epitaxially growing the semiconductor material 24, p-type dopants such as boron are introduced, preferably to a concentration of between about $10^{15}/cm^3$ to $10^{16}/cm^3$.

Figure 4:
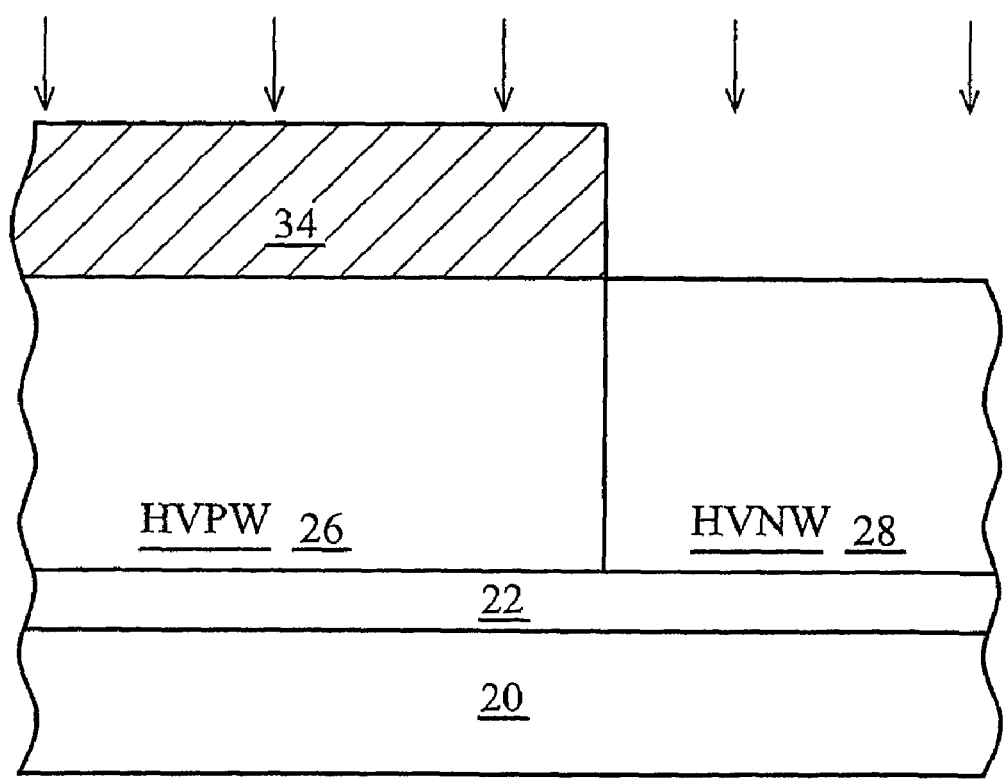

A photo resist 34 is formed, as shown in FIG. 4. The photo resist 34 is patterned using lithography techniques. An n-type impurity implantation is then performed in order to form an N-well region 28, also equally referred to as high-voltage n-well (HVNW) region 28. The HVNW region 28 preferably comprises antimony and/or arsenic, which neutralizes the p-type impurities in the P-epi layer 24 and converts the implanted region to n-type. After the implanting, the HVNW region 28 preferably has a net n-type impurity concentration of between about $10^{15}/cm^3$ and about $10^{16}/cm^3$. The bottom of the HVNW region 28 preferably reaches the NBL 22, although a shallower HVNW region 28 may be formed. Due to the masking by the photo resist 34, a portion of the P-epi layer 24 that is masked forms a p-well region 26, which is equally referred to as a high-voltage p-well (HVPW) region 26. The photo resist 34 is then removed.

In alternative embodiments, the doped semiconductor layer 24 can be of n-type. By masking a portion of the doped semiconductor layer 24 and doping with p-type impurities, the HVPW region 26 and HVNW region 28 can be formed.

Figure 5A:
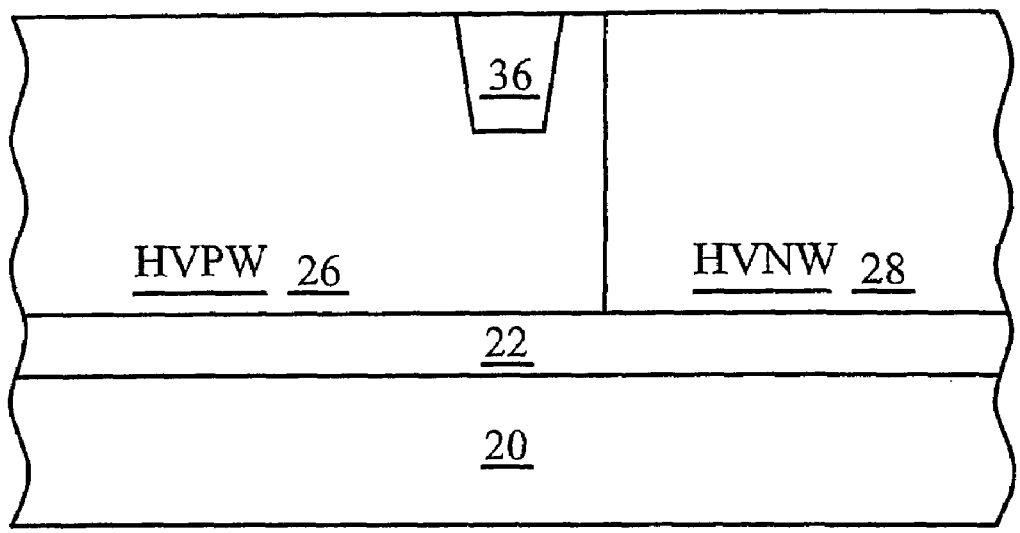
Figure 5B:
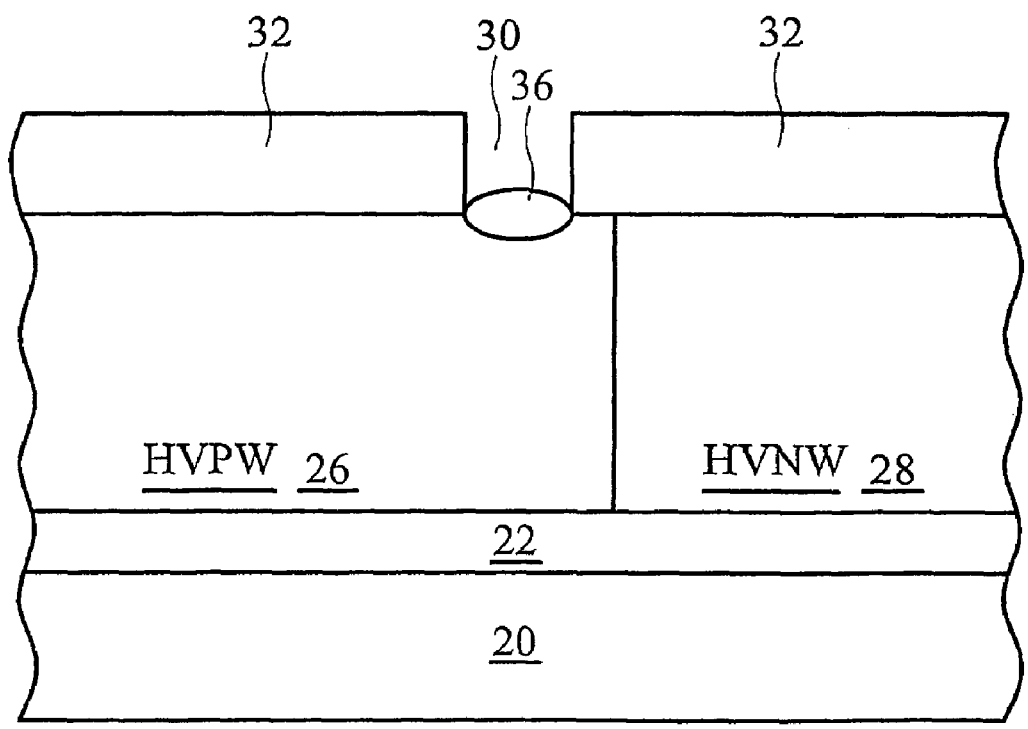

FIGS. 5A and 5B illustrate the formation of a field region 36. In the preferred embodiment, as shown in FIG. 5A, the field region 36 is formed by forming a trench in the HVPW region 26, filling the trench with a dielectric material, such as $SiO_2$ or HDP oxide, and performing a chemical mechanical polish to level the surface. The resulting shallow trench isolation (STI) region is the field region 36. In other embodiments, as shown in FIG. 5B, a mask layer 32, preferably formed of SiN, is formed over the HVPW region 26 and HVNW region 28. The mask layer 32 is then patterned, forming an opening 30. An oxidation is then performed, and the field region (also referred to as field oxide) 36 is formed through the opening 30. Typically, for 0.25 μm technology and under, field regions are preferably STI regions. For technologies with greater scale, field regions are preferably field oxides. The field region 36 is preferably formed close to the interface of the HVPW region 26 and HVNW region 28, so that the subsequently formed MOS device crosses both regions.

Figure 6:
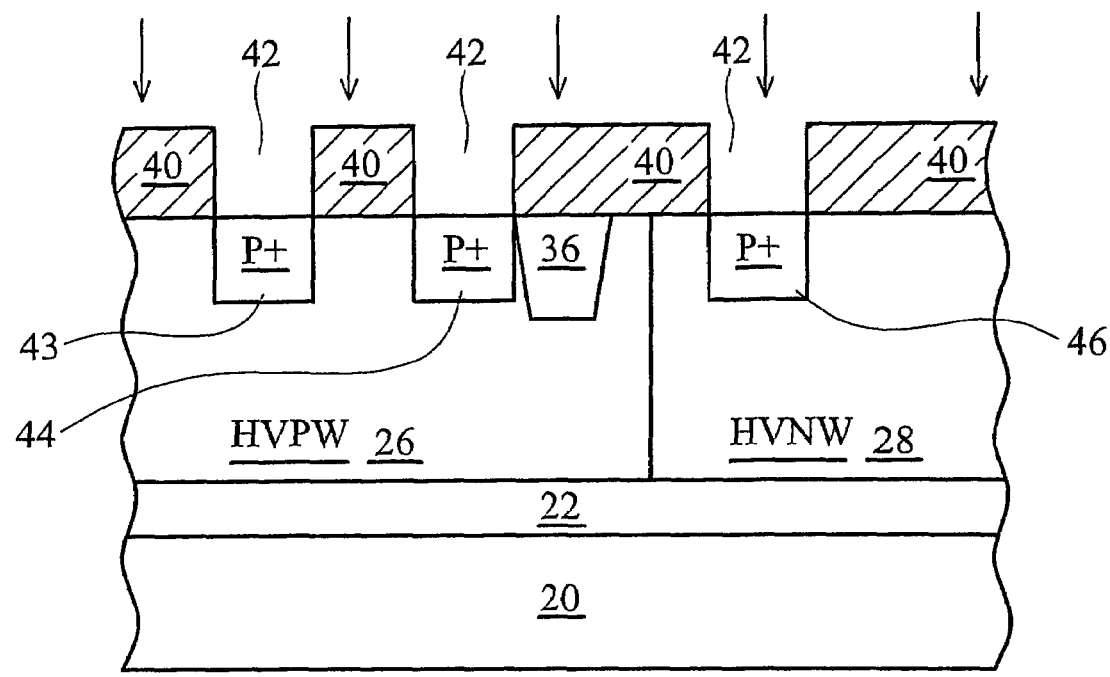

Another photo resist layer 40 is deposited and patterned, forming openings 42, as shown in FIG. 6. A p-type dopant implantation is performed, forming P+ regions 43 and 44 in the HVPW region 26 and a P+ region 46 in the HVNW region 28. Preferably, the P+ regions 43, 44 and 46 comprise carbon and/or other p-type dopants and are heavily doped to a concentration of greater than about $10^{20}/cm^3$.

Figure 7:
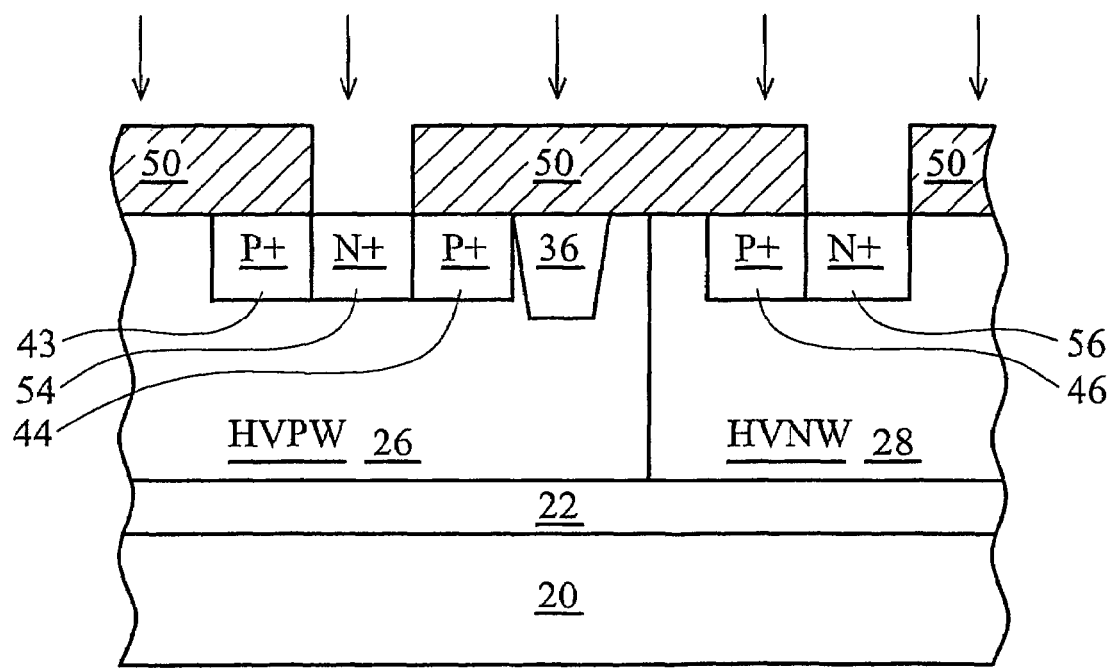

Referring to FIG. 7, the photo resist 40 is removed and a photo resist layer 50 is formed and patterned. An n-type dopant implantation is performed, forming N+ region 54 in the HVPW region 26 and N+ region 56 in the HVNW region 28. The N+ dopant implant may comprise phosphorus and/or arsenic (As). Preferably, the n-type dopant is heavily doped to a concentration of greater than about $10^{20}/cm^3$. In the described embodiments, heavily doped means an impurity concentration of above about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. After the implantation, the photo resist 50 is removed. One skilled in the art will realize that the order of forming N+ regions and P+ regions is a matter of mere design choice.

Figure 8:
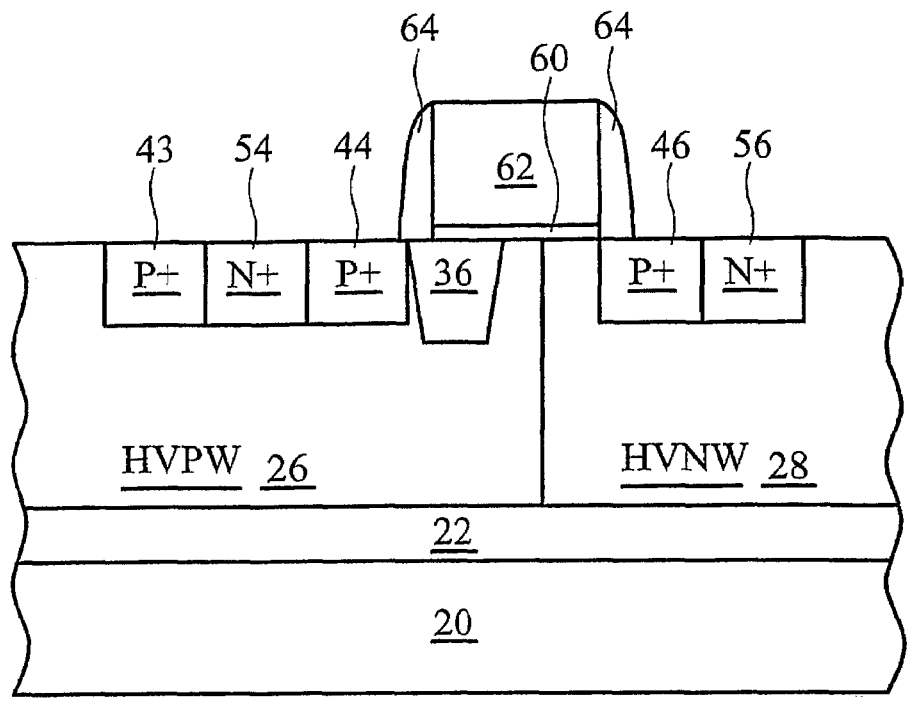

FIG. 8 illustrates the formation of a gate dielectric 60, a gate electrode 62 and spacers 64. The formation processes are well known in the art, and thus are not repeated herein. Preferably, a side edge of the gate electrode 62 falls within a region over the field region 36, thus the gate electrode 62 is spaced apart from the P+ region 44, and a high voltage can be applied.

Figure 9:
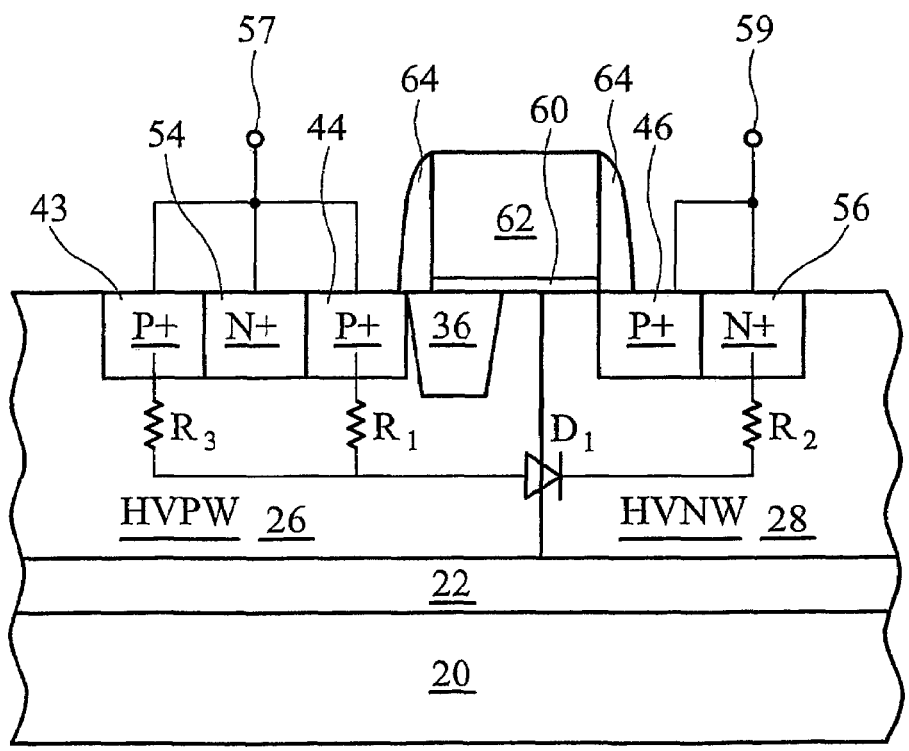

Preferably, the P+ regions 43, 44 and N+ region 54 are interconnected, and the P+ region 46 and N+ region 56 are interconnected. FIG. 9 illustrates a parasitic P-N diode $D_1$ formed between the HVPW region 26 and HVNW region 28. Resistors $R_1$ and $R_3$ symbolize parasitic resistors in the HVPW region 26. Resistor $R_2$ symbolizes a parasitic resistor in the HVNW region 28. The P-N diode $D_1$ and the resistors $R_1$, $R_2$ and $R_3$ form an ESD current path for forward mode ESD. When an ESD transient occurs, causing the voltage at node 57 to be higher than the voltage at node 59, an ESD current flows through the ESD current path, protecting the structure shown in FIG. 9 from forward mode ESD.

Figure 10A:
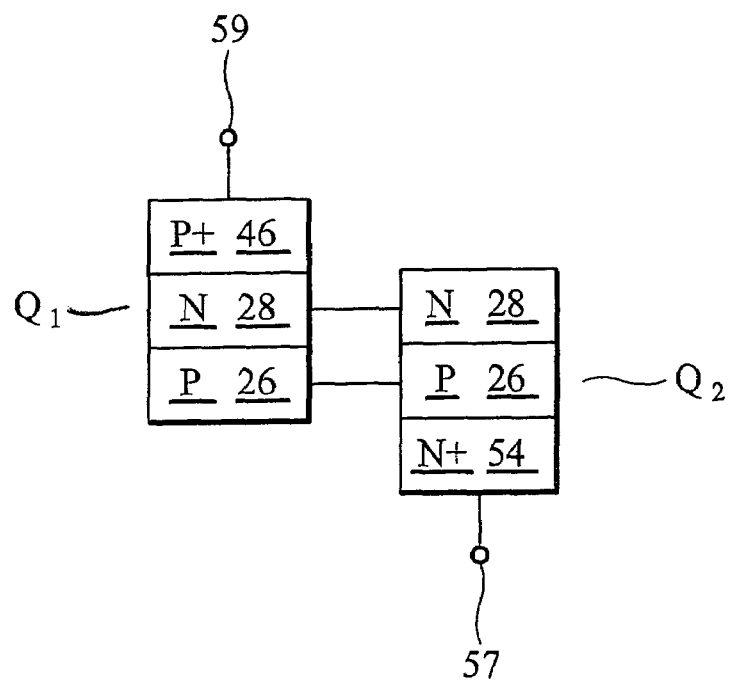
Figure 10B:
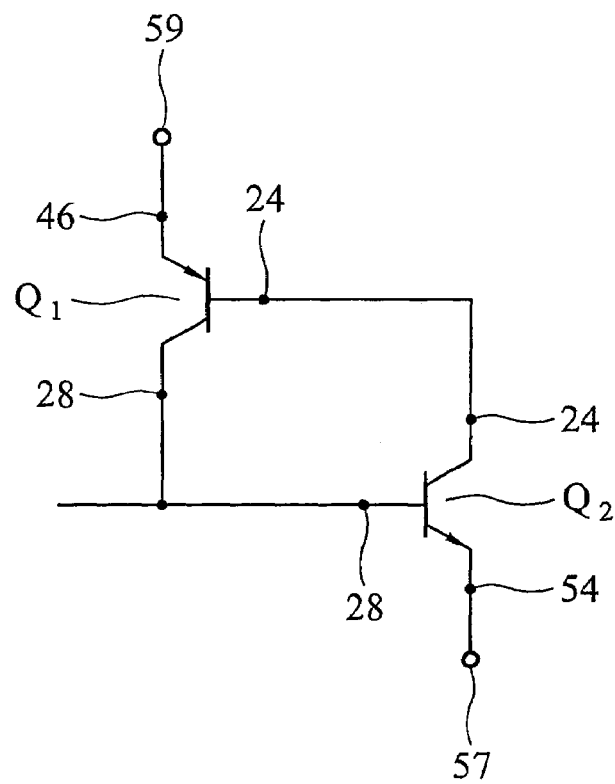

The preferred embodiments of the present invention also comprise two bipolar transistors. As illustrated in FIG. 10A, the emitter, base and collector of a first (PNP) transistor $Q_1$ are formed by the P+ doped region 46, HVNW region 28, and HVPW region 26, respectively. The emitter, base and collector of a second (NPN) transistor $Q_2$ are formed by the N+ doped region 54, the HVPW region 26, and the HVNW region 28, respectively. The circuit combining the bipolar transistors $Q_1$ and $Q_2$ is a typical silicon controlled rectifier (SCR). FIG. 10B illustrates a corresponding equivalent circuit diagram. As is known in the art, the SCR has a characteristic called "snapback," which means that when a high reference voltage is applied between the nodes 59 and 57, the SCR is turned on, and a current flows through the SCR, so that the voltage between the nodes 59 and 57 snaps back and is lowered. The snap back voltage is partially determined by the doping concentrations in the HVPW region 26 and HVNW region 28, and can be increased by increasing the doping concentrations, or decreased by decreasing the doping concentrations.

Figure 11:
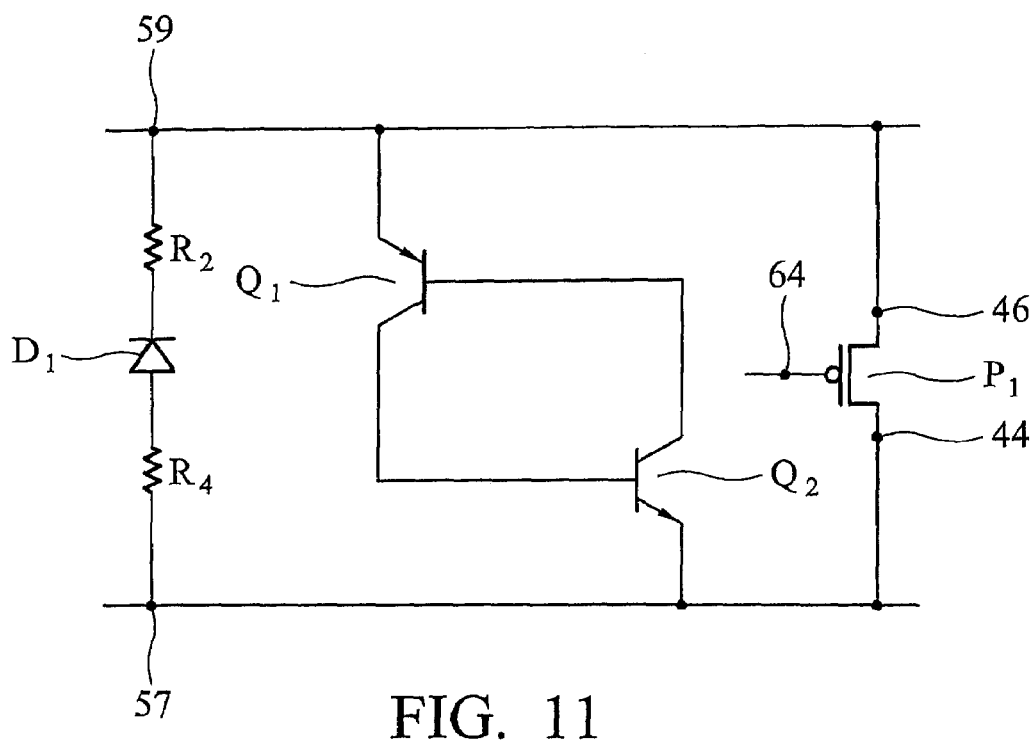

FIG. 11 illustrates a schematic equivalent circuit of the preferred embodiments of the present invention. The equivalent circuit includes a PMOS transistor $P_1$ comprising a source region 46, a drain region 44 and a gate 64, the diode $D_1$, and a p-type SCR (PSCR) comprising the bipolar transistors $Q_1$ and $Q_2$. The resistor $R_4$ is an equivalent resistor of resistors $R_1$ and $R_3$ connected in parallel. The PSCR protects the PMOS $P_1$ from reverse mode ESD when the voltage at node 59 is higher than the voltage at node 57. Conversely, the diode $D_1$ protects the PMOS $P_1$ from forward mode ESD when the voltage at node 57 is higher than the voltage at node 59. Therefore, the preferred embodiments of the present invention have robust ESD performance for both forward and reverse mode ESD.

Figure 12:
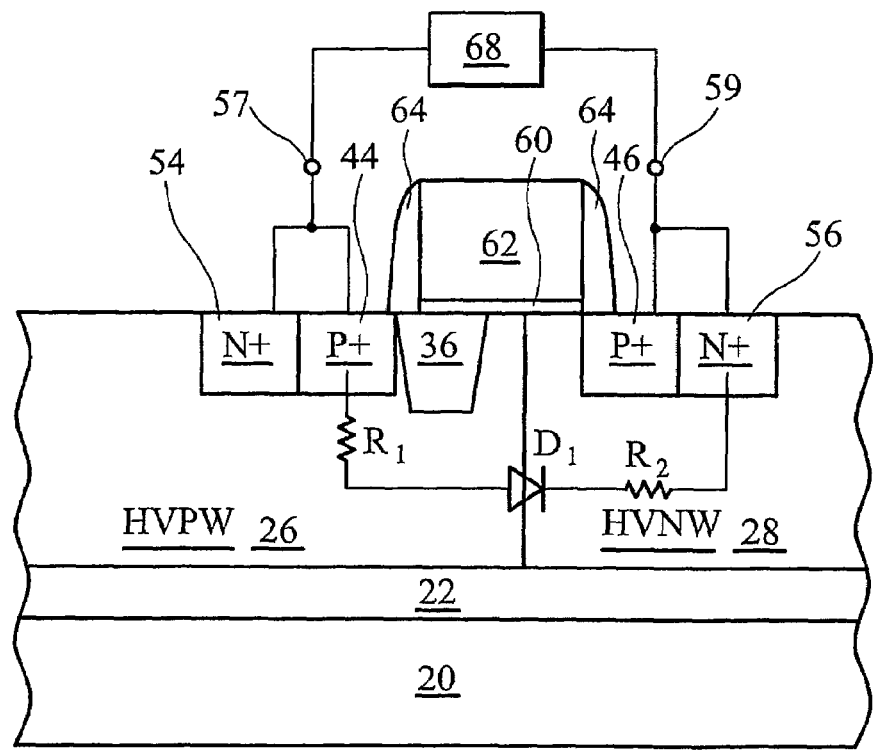

Alternative preferred embodiments of the present invention, which comprise less components, are shown in FIG. 12, wherein the HVPMOS comprises source/drain P+ regions 44 and 46, an STI region 36, a gate dielectric 60, a gate electrode 62, and gate spacers 64. An N+ region 54 is formed adjacent the P+ region 44. The P+ region 46, HVNW region 28, HVPW region 26 and N+ region 54 form a parasitic SCR. In other preferred embodiments, an N+ region 56 can be further formed, providing forward mode ESD protection by forming a current path comprising the P-N diode $D_1$ and parasitic resistors $R_1$ and $R_2$.

Although the preferred embodiments of the present invention are preferably used as highly reliable HVPMOS devices, due to the ability to discharge electrostatic discharge (ESD) current, they can also be used as ESD protection devices. As also shown in FIG. 12, the circuitry of an integrated circuit 68, such as a logic, a memory array, or the like, can be coupled to nodes 59 and 57. If an electrostatic transient occurs to one of the output nodes 59 and 57 of the integrated circuit 68, the ESD current can be conducted through the PSCR, and the voltage between nodes 59 and 57 is lowered, protecting the integrated circuit 68.

Figure 13:
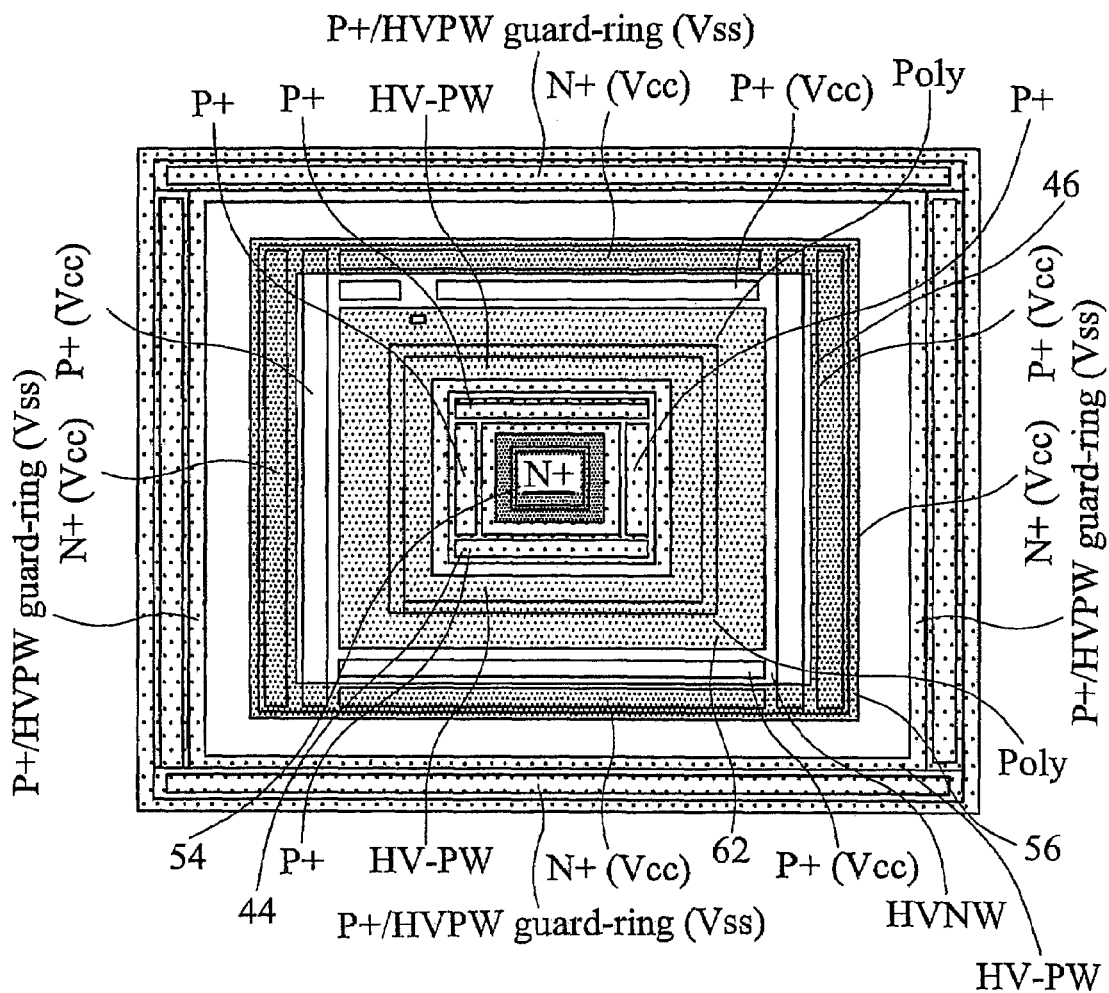
FIG. 13 illustrates an exemplary layout of the preferred embodiments of the present invention.

An exemplary layout of the preferred embodiments of the present invention is shown in FIG. 13. It is noted that components 54, 44, 62, 46 and 56 shown in FIG. 12 are arranged from inside to outside, with the outside components substantially enclosing the inside components. However, as is known in art, in other layouts, components 54, 44, 62, 46 and 56 can be arranged as parallel strips.

Figure 14:
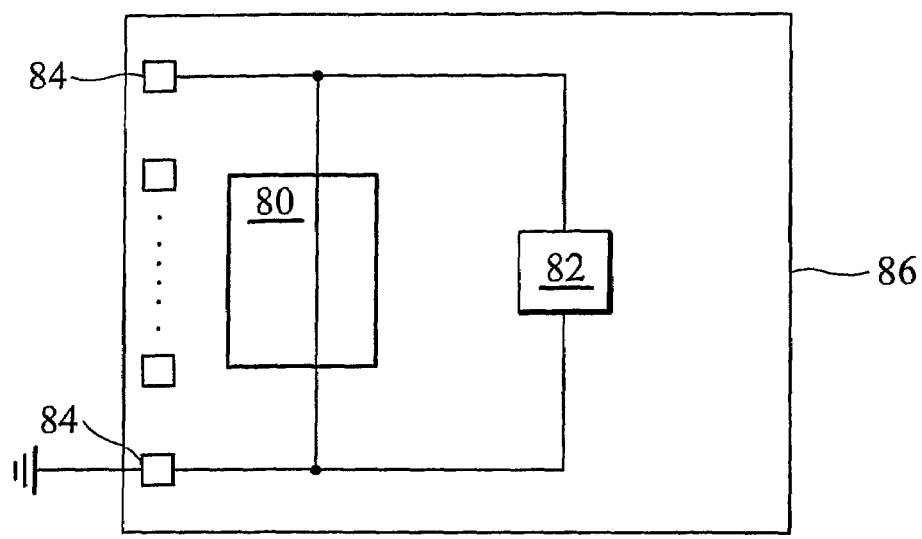
FIGS. 14 and 15 illustrate exemplary protection schemes at chip and package levels, respectively.
Figure 15:
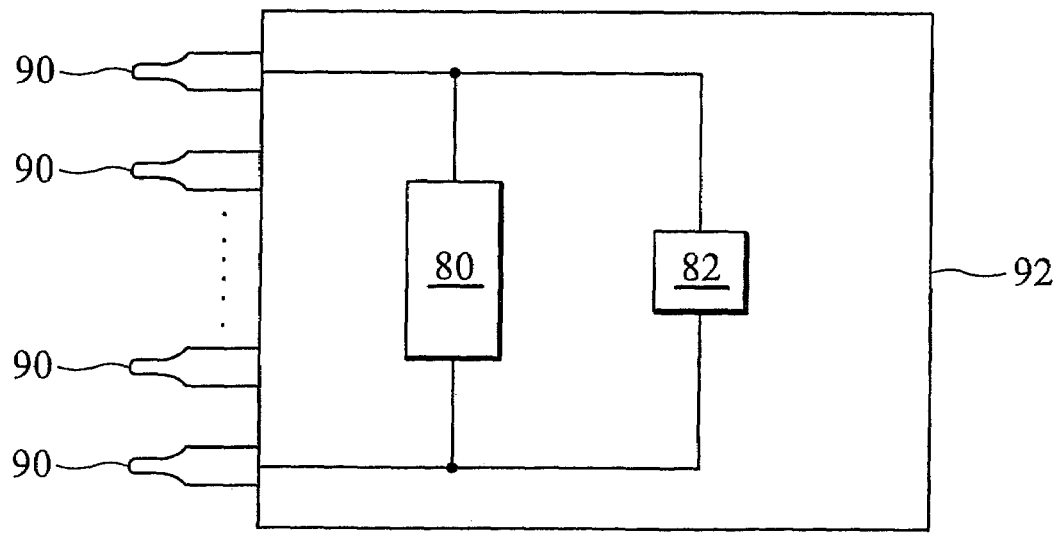

The preferred embodiments of the present invention may be used for circuit level protection, as previously discussed using FIG. 12, or for chip level, and even package level protections. FIG. 14 illustrates a chip level protection scheme. An integrated circuit 80 is coupled between (input/output) I/O pads 84 of a chip 86. If an ESD transient occurs between the I/O pads 84, a PSCR 82 conducts the ESD current, and the integrated circuit 80 and other integrated circuits (not shown) coupled between the I/O pads 84 are protected. FIG. 15 illustrates a similar protection scheme at the package level. The PSCR 82 is electrically coupled to the I/O pins 90 of a package 92, providing package level protection to the circuit 80.

Figure 16:
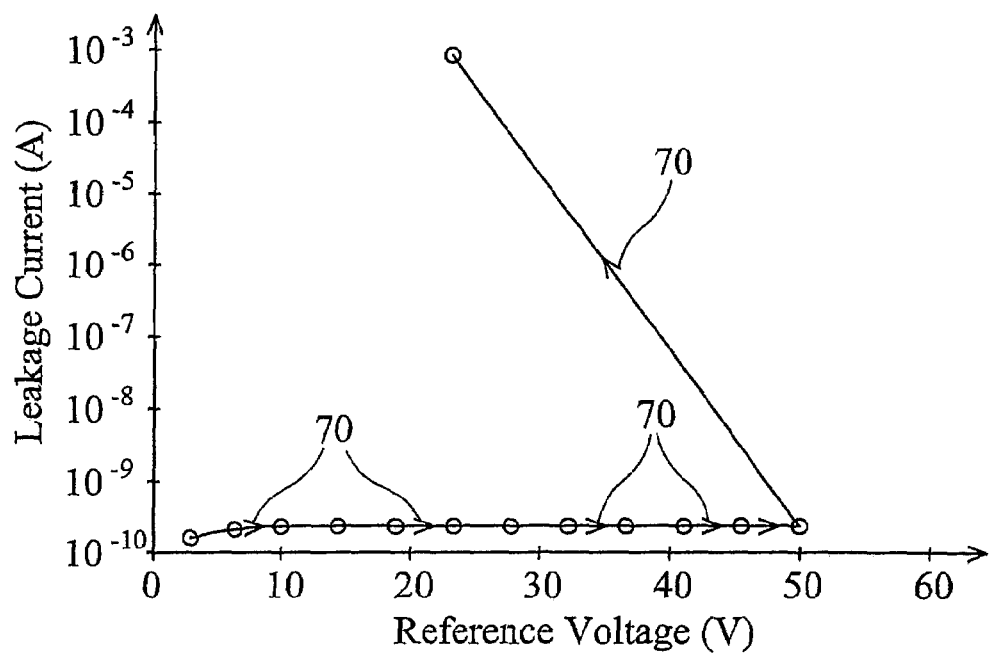
FIG. 16 illustrates experiment results of a conventional high-voltage PMOS, wherein the leakage currents increase due to reverse mode ESD stresses.
Figure 17:
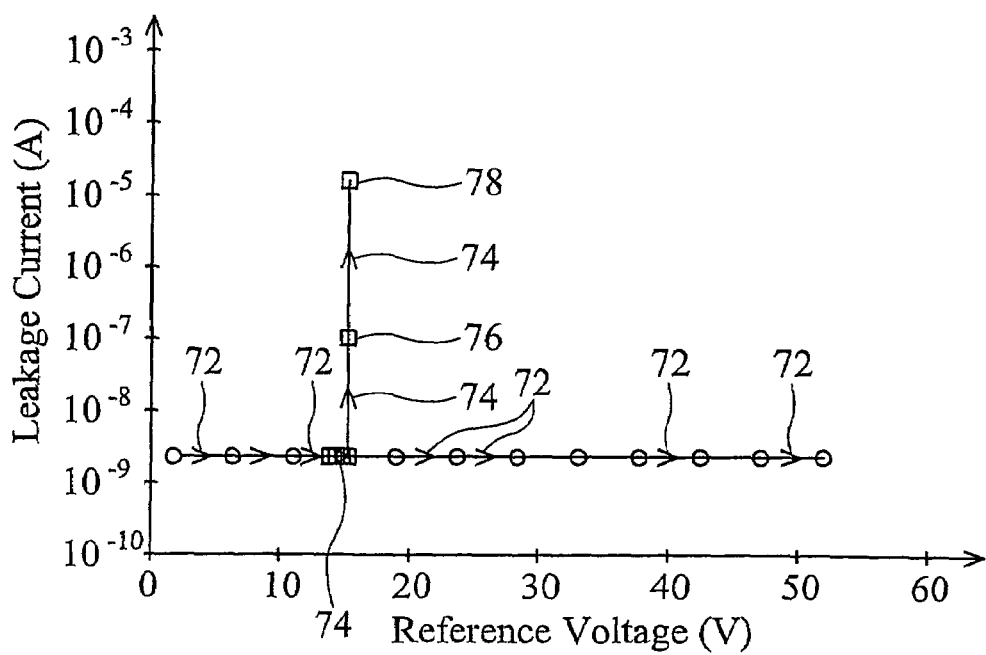
FIG. 17 illustrates experiment results of the preferred embodiments of the present invention, wherein the leakage currents are not affected by reverse mode ESD stresses until the preferred embodiments are damaged by high currents.

The effects of the preferred embodiments of the present invention are shown in FIGS. 16 and 17. FIG. 16 illustrates leakage current of a conventional HVPMOS device as a function of reference voltage applied between its source and drain regions. Each circle indicates a voltage stress by applying a (reverse mode) reference voltage. In the direction of arrows 70, the reference voltage increases. It is noted that when the reference voltages are less than about 50 volts, the leakage current of the HVPMOS device stays the same at around $8 \times 10^{-9}$ amps. When the reference voltage is greater than about 50 volts, the HVPMOS is turned on and the voltage snaps back. At this point, the leakage current increases to over $10^{-4}$ amps, indicating the device is degraded.

FIG. 17 illustrates leakage current of preferred embodiments of the present invention as a function of reference voltage applied between nodes 59 and 57. Each circle indicates a voltage stress by applying a reference voltage. In the direction of arrows 72, the reference voltages, which are smaller than the turn-on voltage of the PSCR, increase. When the reference voltages are less than about 52 volts, the leakage currents stay the same at around $8 \times 10^{-9}$ amps. When the reference voltages are greater then about 52 volts, the PSCR is turned on and the voltage snaps back. Squares connected by arrows 74 show voltage drops between nodes 59 and 57 after the PSCR are turned on. It is observed that after the PSCR is turned on, the leakage currents stay the same. The performance of the PSCR, therefore, is not affected by the ESD stresses, until the device is damaged by very high reverse currents (points 76 and 78).

Comparing FIGS. 16 and 17, it is found that the conventional HVPMOS device is vulnerable to reverse mode ESD, while the preferred embodiments of the present invention, due to an ability to conduct reversed current, is protected from the reverse ESD.

Experiments revealed that the preferred embodiments of the present invention could sustain significantly higher electrostatic voltages at both machine mode and human body mode, particularly for reverse mode ESD. Table 1 shows the experiment results.

TABLE 1

| Device | HBM forward | HBM reverse | MM forward | MM reverse |
|---|---|---|---|---|
| HVPMOS | >8 kV | <0.5 kV | ~150 V | <50 V |
| PSCR | >8 kV | ~7 kV | ~850 V | ~650 V |

It is found from Table 1 that in machine mode, the preferred embodiments of the present invention can sustain a forward voltage of about 850 volts, and a reverse voltage of about 650 volts. A conventional HVPMOS, however, can only sustain a forward voltage of about 150 volts, and a reverse voltage of less than about 50 volts.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a substrate doped with a first conductivity type impurity;
   a buried layer, doped with an impurity of a second conductivity type opposite the first conductivity type, in the substrate;
   a first high-voltage well region, doped with an impurity of the first conductivity type, overlying the buried layer;
   a second high-voltage well region, doped with an impurity of the second conductivity type, overlying the buried layer and in contact with the first high-voltage well region;
   a field region substantially in the first high-voltage well region and substantially close to an interface between the first high-voltage well region and the second high-voltage well region;
   a first and a second doped region doped with an impurity of the first conductivity type, wherein the first doped region is in the first high-voltage well region and physically in contact with the field region, and the second doped region is in the second high-voltage well region;
   a third doped region of the second conductivity type in the first high-voltage well region and in contact with the first doped region;
   a fourth doped region of the second conductivity type in the second high-voltage well region and in contact with the second doped region;
   a gate dielectric on the field region and the first and second high-voltage well regions, the gate dielectric having a first side edge substantially aligned with an edge of the second doped region, and a second side edge over the field region; and
   a gate electrode on the gate dielectric.

2. The device of claim 1 wherein the first conductivity type is p-type, and the second conductivity type is n-type.

3. The device of claim 1 wherein the field region is a shallow trench isolation region.

4. The device of claim 1 wherein the field region is a field oxide.

5. The device of claim 1 further comprising a fourth doped region of the first conductivity type in the first high-voltage well region and in contact with the third doped region.

6. The device of claim 1 wherein the first, the second, and the third doped regions each have an impurity concentration of greater than about $10^{20}/cm^3$.

7. The device of claim 1 wherein the buried layer has an impurity concentration of between about $10^{16}/cm^3$ and about $10^{18}/cm^3$.

8. The device of claim 1 wherein the first and second high-voltage well regions each have an impurity concentration of between about $10^{15}/cm^3$ and about $10^{16}/cm^3$.

9. The device of claim 1 wherein the device is in a semiconductor chip, and wherein the first and the second doped regions are electrically coupled to input/output pads of the semiconductor chip.

10. The device of claim 1 wherein the device is packaged in a package, and wherein the first and the second doped regions are electrically coupled to input/output pins of the package.

11. A semiconductor device comprising:
    a PMOS transistor comprising:
       a first source/drain region doped with a p-type impurity in a high voltage p-well (HVPW) region;
       a second source/drain region doped with the p-type impurity in a high voltage n-well (HVNW) region, wherein the HVPW region and the HVNW region physically contact each other;
       a field region in contact with the first source/drain region, the field region being substantially close to an interface of the HVPW region and the HVNW region and substantially underlying a gate dielectric;
       a first heavily doped n-type (N+) region in the HVPW region and adjacent the first source/drain region;
       a second N+ region in the HVNW region and adjacent the second source/drain region; and
       a first heavily doped p-type (P+) region in the HVPW region, wherein the first N+ region is between and abutting the first source/drain region and the first P+ region;
    a heavily doped n-type (N+) buried layer underlying the HVPW region and the HVNW region; and
    a p-type substrate underlying the N+ buried layer.

12. The semiconductor device of claim 11 wherein the first N+ region and the first source/drain region are interconnected.

13. The semiconductor device of claim 11 wherein the HVNW region contacts the N+ buried layer.

14. The semiconductor device of claim 11 wherein the HVNW region is spaced apart from the N+ buried layer by a portion of the HVPW region.

15. The device of claim 1 wherein the field region is spaced apart from the interface.

16. The semiconductor device of claim 11 wherein the field region is spaced apart from an interface between the HVPW region and the HVNW region.

* * * * *